United States Patent [19]

Mancuso et al.

[11] Patent Number: 4,784,146
[45] Date of Patent: Nov. 15, 1988

[54] ANGLED SEGMENT RECEIVER COIL FOR NMR IMAGING OF A HUMAN HEAD

[75] Inventors: Anthony A. Mancuso; Jeffrey R. Fitzsimmons; Ray G. Thomas, all of Gainesville, Fla.

[73] Assignee: University of Florida, Gainesville, Fla.

[21] Appl. No.: 896,237

[22] Filed: Aug. 14, 1986

[51] Int. Cl.⁴ .............................................. A81B 5/05
[52] U.S. Cl. .................................... 128/653; 324/318; 324/322
[58] Field of Search .................................. 128/1.3–1.5, 128/653; 343/741, 742, 744, 800, 866, 867; 354/307, 309, 318–320, 322; 335/299

[56] References Cited

U.S. PATENT DOCUMENTS

| | | |
|---|---|---|
| 2,461,230 | 2/1949 | Obert . |
| 3,081,428 | 3/1963 | Fowler . |
| 3,518,394 | 6/1970 | Dawson . |
| 3,680,134 | 7/1972 | Doi et al. ............................ 343/744 |
| 4,021,726 | 5/1977 | Garroway et al. . |
| 4,259,638 | 3/1981 | Krueger . |
| 4,354,499 | 10/1982 | Damadian . |
| 4,362,993 | 12/1982 | Young et al. . |
| 4,408,162 | 10/1983 | Egger . |
| 4,450,408 | 5/1984 | Tiemann . |
| 4,468,621 | 8/1984 | Hinshaw . |
| 4,545,384 | 10/1985 | Kawachi ............................ 128/653 |
| 4,590,427 | 5/1986 | Fukushima et al. ................ 324/318 |
| 4,602,234 | 7/1986 | Butson .............................. 324/320 |
| 4,616,181 | 10/1986 | Kemner et al. ..................... 324/318 |

FOREIGN PATENT DOCUMENTS 2149124  6/1985  United Kingdom ................ 324/318

OTHER PUBLICATIONS

J. R. Fitzsimmons, R. G. Thomas, Anthony A. Mancuso, "Proton Imaging with Surface Coils on a 0.15 T Resistive System", *Magnetic Resonance in Medicine*, vol. 2, pp. 180–185 (1985).

Primary Examiner—Ruth S. Smith
Attorney, Agent, or Firm—Dennis P. Clarke

[57] ABSTRACT

An RF receiver coil structure for NMR imaging of a human head attached by a neck to a body (normally lying horizontally), having ear positions, and having a defined axis generally along a line extending from the top of the head through the neck. The coil lies primarily in a coil plane which is horizontal, and thus is properly oriented with reference to the main field orientation of an NMR system. The coil is generally oval in configuration, having sides and defined upper and lower ends spaced by an oval height. The coil is sized for positioning around the head oriented such that the coil upper end is adjacent to the top of the head, the coil sides are generally adjacent to the ear positions, and the defined head axis lies in the defined coil plane. The coil includes an angled segment defined as having a midpoint at the coil lower end and which extends from the midpoint along the coil sides towards the coil upper end for a distance corresponding to approximately one-third of the oval height, terminating at segment endpoints. The angled segment thus diverges beginning at the segment endpoints out of the coil plane at an angle such that the coil lower end clears the neck when positioned around the head. The coil is formed of a tubular conductor, having a tubular diameter (outside diameter) in the approximate range of from ⅜ inch to ¾ inch. The coil has terminal ends at its upper end at which a component unit is located. The component unit includes a capacitor electrically connected to the coil terminal ends to form a parallel resonant circuit.

12 Claims, 2 Drawing Sheets

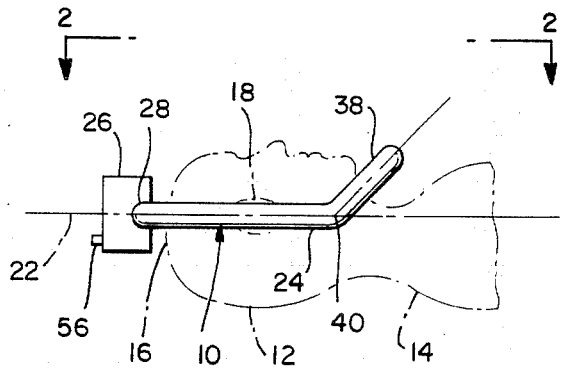
FIG. 1
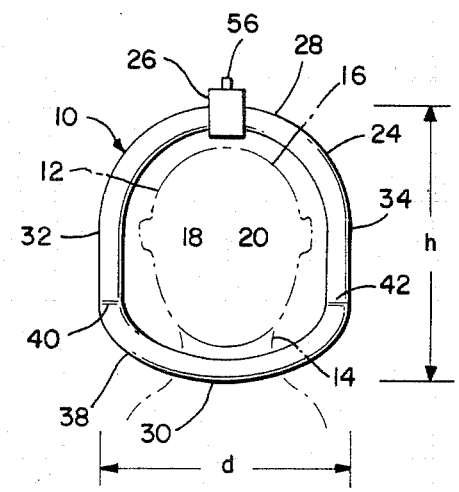
FIG. 2
FIG. 3
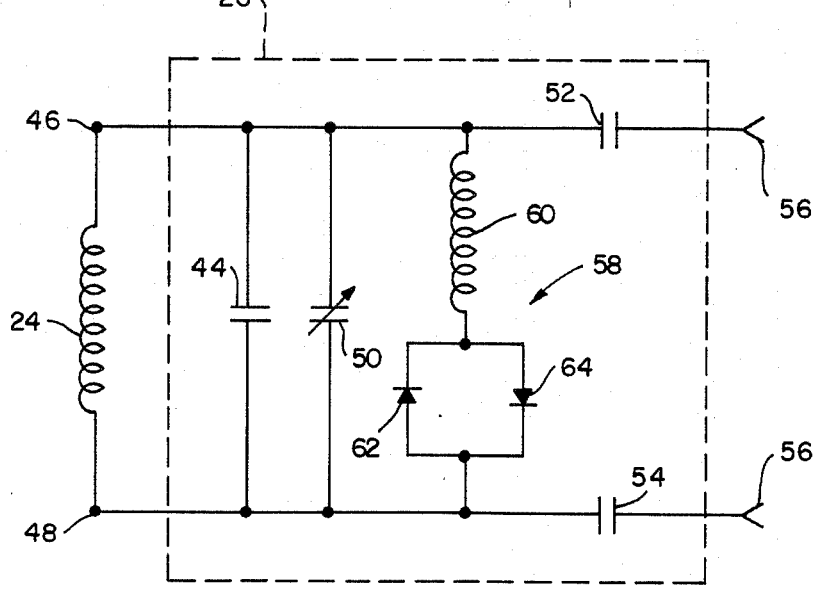

ANGLED SEGMENT RECEIVER COIL FOR NMR IMAGING OF A HUMAN HEAD

BACKGROUND OF THE INVENTION

The present invention relates generally to nuclear magnetic resonance (NMR) imaging apparatus and, more particularly, to high performance receiver coils for NMR Imaging of a human head.

Nuclear magnetic resonance (NMR) imaging is a known technique for obtaining cross sectional images through desired portions of a human body without exposing a patient to ionizing radiation. Briefly, the patient is placed in a static magnetic field which causes magnetic dipoles of atomic nuclei with spin (for example, hydrogen nuclei) to orient themselves with the magnetic lines of force. Like a spinning gyroscope, the spinning nuclei tend to precess with a certain angular frequency, known as the Larmor frequency. By means of a transmitter coil a radio frequency pulse is applied at a frequency which matches the natural precessional frequency. This causes the magnetic dipoles to quickly precess, while absorbing energy. When the excitation pulse ends, the nuclei briefly emit an RF signal known as the free induction signal or free induction decay. The magnetization vector of the nuclei eventually returns to its original position. This emitted RF energy can be detected by inductive coupling to a receiver coil and analyzed in view of the nature of the excitation pulse to build a set of data from which images can be constructed.

It will be understood and appreciated that the present invention is not directed to any of the various techniques for defining the cross sections for which images are constructed (e.g. phase encoding techniques) and the techniques for actually constructing the images. Rather, the present invention assumes the existence of these known techniques. In general, the present invention is concerned with efficiently receiving the emitted RF energy from a region of the body in bulk to provide a signal suitable for analysis.

It is possible for a single coil to serve the transmitter and receiver functions. However, for optimum performance it is desirable to provide separate transmitter and receiver coils due to different design considerations.

For example, the transmitter coil should be large, have good RF homogeneity, and relatively low Q to provide broadband excitation.

The receiver coil, however, should be as small as possible consistent with the region of interest, have a reasonable amount of RF homogeneity, have a high Q (narrow bandwidth), be minimally sensitive to dielectric loading, be comfortable for the patient, and be easy to use so as to provide the minimum connection and set-up time. An RF receiver coil should maximize flux coupling from the patient to the coil surface, and at the same time, in order to prevent damage to the associated preamplifier, be reasonably orthogonal to the transmitter coil so as to minimize coupling between the two coils, and should also function in a plane perpendicular to the main (static) magnetic field.

One important performance criterion of a tuned receiver coil is the signal-to-noise ratio (SNR) which can be obtained. In theory, SNR can be calculated by formula based on the frequency, the magnetic field due to a unit current in the coil, sample volume, loaded circuit Q, filling factor, and resistive loss due to coil impedance. The first three of these variables are easily determined, but the others are not.

In a receiver coil design the specific part of the anatomy is usually considered the starting point. Theoretical analysis is, however, limited by several factors. First, it is difficult to mathematically determine the ideal coil geometry for each organ of interest, giving rise to a large number of possible shapes. Even simple application of Faraday's law of induction may be inappropriate. For example, a multiple turn solenoid may be no better than a single turn solenoid of the same diameter when loaded with a biological sample. Electrical performance criteria such as coil Q may become irrelevant when comparing different coil geometries since Q is simply the ratio of inductive reactance to coil resistance, and inappropriate geometries may have good Qs.

The case of a human head may, at first impression, seem trivial, since it may be viewed as a nicely isolated sphere connected at one end (i.e. the neck), making it feasible to use both surface coil geometries and volume coil geometries.

Worthy of initial consideration is the question of why not use the most ideal coil geometry, the simple solenoid, on the head. The answer to this question depends on the main field orientation of the overall possible in the case of NMR imaging systems where the magnetic field is vertically oriented (assuming the patient is lying horizontally). In such cases, a solenoid receiver coil provides a maximum sensitivity and homogeneity. However, there are few systems where it is practical to apply such a coil.

In the case of the more commonly encountered horizontal bore systems, (most resistive magnet systems and all super conducting magnet whole body systems), the simple solenoid is not applicable because its proper orientation would require that turns of the coil pass through the neck. As a result, this otherwise ideal geometry has been passed by in favor of several other geometries, including the saddle coil, the double elliptical coil, the half saddle, the Alderman Grant resonator, and the slotted tube resonator.

The saddle coil has been the most widely accepted solution to the problem of coil orientation. However, it is clearly not as efficient as the solenoid, even though it does provide good homogeneity and reasonable sensitivity if constructed properly. There also exists a half saddle geometry which has the advantage of an open top which makes patient use extremely easy. The patient simply lies down on a cradle which has the half saddle coil within. Unfortunately, this design also suffers loss in sensitivity when compared to the conventional fully saddle geometry.

In summary, during the course of NMR imaging, energy is inductively coupled from the patient to an RF receiver coil, where the emf induced in the coil and therefore the SNR available for image construction depends in part on flux coupling between the patient and the coil. Current low field NMR Imaging Systems are limited to thick slice (1 cm) medium resolution images of the brain due partly to RF coil inefficiency; SNR requirements for thin section 0.4 to 0.6 cm images are 40% to 60% higher. Numerous RF coil designs have bee suggested in the literature, including solenoids, saddle coils, crossed elliptical, toroidal, and slotted tube resonators. Solenoids are perhaps the oldest, but they are inappropriate in a magnet with a horizontal bore since they must be oriented in a vertical axis. While the crossed elliptical coil and the toroid overcome the orientation problem, they are much less efficient than a solenoid. While a slotted tube resonator is nearly as efficient as a solenoid, it has such low inductance that it is difficult to make it perform properly at the frequencies involved in a 0.15 T NMR imaging system (wherein the frequency of interest is 6.25 MHz). Thus, previously proposed coils are inadequate.

SUMMARY OF THE INVENTION

Accordingly, it is an object of the invention to provide an RF receiver coil structure for NMR imaging of a human head, which coil structure has a high signal to noise ratio, is easy to use and minimizes claustrophobic discomfort to the patient, and has minimal coupling to the transmitter coils in an NMR imaging system.

Briefly, in overall form the present invention can be viewed as a modified solenoid coil structure, which may have a single turn. The receiver coil is intended for NMR imaging of a human head attached by a neck to a body (normally lying horizontally), having ear positions, and having a defined axis generally along a line extending from the top of the head through the neck. The coil lies primarily in a coil plane which is horizontal, and thus is properly oriented with reference to the main field orientation of the NMR system. Consistent with the shape of a head, the coil is generally oval in configuration, having sides and defined upper and lower ends spaced by an oval height. The coil is sized for positioning around the head oriented such that the coil upper end is adjacent to the top of the head, the coil sides are generally adjacent to the ear positions, and the defined head axis lies in the defined coil plane. As a result, the cross sectional area of the coil is minimized, for increased flux coupling.

In order to accommodate the neck with no angular tilting of the coil and no special patient positioning, the coil includes an angled segment defined as having a midpoint at the coil lower end and which extends from the midpoint along the coil sides towards the coil upper end for a distance corresponding to approximately one-third of the oval height, terminating at segment endpoints. The angled segment thus diverges beginning at the segment endpoints out of the coil plane at an angle such that the coil lower end clears the neck when positioned around the head. Typically, the angle at which the angled segment diverges is approximately 45° with reference to the coil plane.

In order to minimize coil resistance, which is a fundamental consideration, the coil is formed of a material which has good electrical conductivity, such as high purity copper. The shape of the conductor is important since the "skin effect" at the frequencies employed concentrates current at the surface of a conductor, and sharp edges are to be avoided since they tend to concentrate magnetic flux, and degrade the homogeneity of the field.

The coil of the invention employs a tubular shaped conductor, having a tubular diameter (outside diameter) in the approximate range of from ⅜ inch to ¾ inch. Such a tubular conductor maximizes the amount of cross sectional area available for conduction, efficiently uses conductor material, and provides more homogeneous near magnetic fields due to the larger turning radius and gradual flux change.

While high purity copper tubing has been found to be acceptable, it may be desirable to provide a silver plating for even greater conductivity.

The coil has terminal ends at its upper end at which a component unit is located. The component unit includes a capacitor electrically connected to the coil terminal ends to form a parallel resonant circuit. This arrangement allows efficient operation of the coil, and facilitates connection to receiver electronics.

In summary, the coil of the invention is made of large diameter pure copper tubing for minimal resistance. It is shaped in such a way as to use an absolute minimum of conductor, while still surrounding the volume of interest. It has a magnetic field which very closely approximates the volume of the human head, in other words, it has a very high "filling factor". Thus it is a volume coil and is much more efficient than a surface coil (e.g. a saddle coil) in this regard. The coil structure of the invention is an open structure which is easy to position over a patient's head, and leaves the region above the face free, reducing claustrophobic problems. The structure is easy to construct and maintain.

Perhaps most significantly, the invention provides a signal-to-noise ratio (SNR) which is higher than conventional designs in the literature. In an NMR imaging system, SNR is a limiting factor on slice thickness and resolution. The SNR improvement of the invention thus allows the operator to choose either thinner slices or higher in plane spacial resolutions, while maintaining the SNR ratios previously maintainable only with thick slice clearly resolved images. More specifically, the present invention permits the acquisition of high resolution ($256 \times 192$), thin section (0.4 to 0.6 cm) images in a reasonable imaging time (6 to 8 minutes).

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings in which:

FIG. 1 is an elevational side view depicting a receiver coil structure of the invention applied to the head of a patient;

FIG. 2 is a plan view taken along line 2—2 of FIG. 1;

FIG. 3 is an electrical schematic diagram depicting electrical components within a component unit; and.

DETAILED DESCRIPTION

Figure 4:
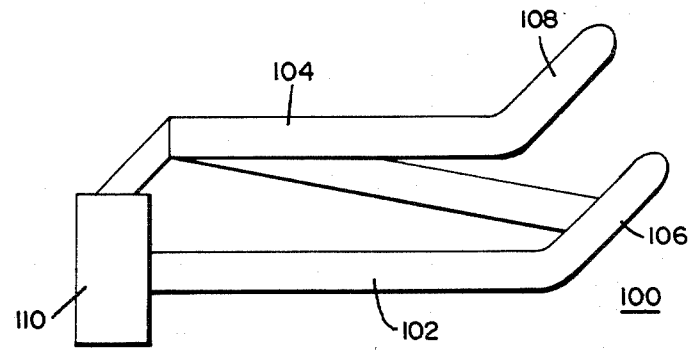
FIG. 4 shows an elevational side view of a multiple turn receiver coil structure.

With reference now to FIGS. 1 and 2, a receiver coil structure 10 in accordance with the invention is shown applied to a human head 12 attached by a neck 14. It will be understood that the receiver coil structure 10 and the head 12 are within an NMR imaging system, not otherwise depicted.

For purposes of definition, the head 12 has a top 16, ear positions 18 and 20, and has a defined axis 22 generally along a line extending from the top 16 of the head through the neck 14.

The coil structure 10 more particularly comprises a coil 24 lying primarily in a coil plane, and a component unit 26 located at the upper end 28 of the coil 24. As shown in FIG. 2, the component unit 26 bridges terminal ends of the coil 10.

As noted above, the coil 24 of the invention is formed of a tubular conductor, having a tubular diameter (outside diameter) in the approximate range of from ⅜ inch to ¾ inch. Such a tubular conductor maximizes the amount of cross sectional area available for conduction, efficiently uses conductor material, and provides more homogeneous near magnetic fields due to the larger turning radius and gradual flux change.

While high purity copper tubing has been found to be acceptable, it may be desirable to provide a silver plating for even greater conductivity.

As may be seen from FIG. 2, the coil 24 is generally oval in configuration having also a lower end 30 spaced from the upper end 28 by an oval heighth of approximately 25 to 30 cm, and coil sides 32 and 34 spaced apart by an oval diameter d which is approximately 18 to 20 cm.

The coil 24 is sized for positioning around the head 12 oriented such that the coil upper end 28 is adjacent the top 16 of the head, the coil sides 32 and 34 are generally adjacent the ear positions 18 and 20, and the defined head axis 22 lies in the defined coil plane.

In order to accommodate the neck 14 with no angular tilting of the coil 24 and no special patient positioning, the coil 24 includes an angled segment 38 defined as having a midpoint at the coil lower end 30 and which extends from the midpoint along the coil sides towards the coil upper end for a distance corresponding to approximately one-third of the oval heighth, terminating at segment endpoints 40 and 42. The angled segment 38 thus diverges beginning at the segment endpoints 40 and 42 out of the coil plane at an angle such that the coil lower end clears the neck 14 when positioned around the head 12. Typically, the angle at which the angled segment 38 diverges is approximately 45° with reference to the coil plane.

Due to the importance of size in maintaining coil efficiency, it is preferable to provide a set of receiver coil structures in accordance with the invention appropriately sized for small, medium and large patient heads.

The single turn coil 24 illustrated is representative only, as the coil 24 may comprise a plurality of turns.

With reference to FIG. 3, the component unit 26 more particularly may be seen to include a capacitor 44 electrically connected to terminal ends 46 and 48 of the coil 24 for operation as part of a parallel resonant circuit. Capacitor 44 is fixed, and a variable capacitor 50, of smaller capacitance value (e.g. 6-67 pf), is connected in parallel to provide fine tuning. Impedance matching is provided by capacitors 52 and 54, which terminate in a suitable connector, such as a BNC connector represented at 56. The output impedance is 50 Ohms. It will be appreciated that the circuitry within the component unit 26 comprises a balanced matching network, which minimizes the dielectric losses inherent in imaging of the human body.

In order to minimize transmitter feedthrough, a suppression network 58 is included, comprising an inductor 60 having an inductance of approximately 10 microhenrys in series with a pair of paralleled back-to-back diodes 62 and 64. As shown in FIG. 4, a multiple turn coil 100 according to the present invention includes lower and upper turns 102 and 104 having respective angled segments 106 and 108 and a component unit 110.

EXPERIMENTAL RESULTS

A number of experiments have been completed which show that the signal intensity achievable with the angled segment receiver coil of the present invention can be significantly greater than a saddle geometry coil of similar dimensions (insofar as it is possible to make a different geometry have similar dimensions).

In particular, four coils were constructed using ⅜ inch O.D. high purity copper tubing. Each coil geometry was built to a scale sufficient to image a human head. The four coils included, (1) a single-turn half saddle for purposes of comparison, (2) a single-turn angled segment receiver coil in accordance with the invention, (3) a single-turn full saddle for purposes of comparison, and (4) a three-turn angled segment receiver coil in accordance with the invention. Each coil was tuned to 6.25 MHz and matched to 50 Ohms impedance. Balanced matching capacitors were used in each case to minimize parasitic losses, and all capacitors were high quality disc ceramic NPO/COG types. The coil tuning networks were as depicted in FIG. 3, and a non-ferrous tuning capacitor 50 was used to tune each circuit over a range of ±200 kHz. The Q of each coil was evaluated with and without a one liter bottle of normal saline solution centered in each coil.

Frequency shift due to dielectric loading was noted in each case using a non-conductive sample. Each coil was then placed in the center of the field of a 0.15 T resistive NMR imaging system and re-tuned to 6.25 MHz to correct for the inductive effects of the magnetic bore and shim system.

Images were then acquired using a spin-echo pulse technique with a TR of 500 msec and a TE of 30 msec. A single sagital 1 cm slice and a single average was used to obtain the data for signal to noise ratio (SNR) calculation. After magnitude reconstruction of each image a large region of interest was placed in the center of the sample to obtain the mean signal intensity. The region was then moved to the side of the sample and the mean noise and RMS noise were obtained. The same imaging experiments were repeated using a phantom with 1 liter of 50% 1, 2 propandiol and water, 1 liter of 50% normal saline and water and, finally, with a live human head.

The data for each coil and phantom are presented in TABLE I below. The three-turn angled segment receiver coil of the invention provided the highest SNR of the four coils evaluated. (However, it may also be noted that the three-turn angled segment coil has the highest $Q_e/Q_L$ ratio which indicates its sensitivity to the sample. This ratio is not, however, the sole determinant of SNR as may be seen by the data on the full-saddle geometry).

The mixture of saline and water provided an estimate of coil performance, but was not an accurate guide to SNR in the live human head. Consequently, a detailed analysis of the SNR in the head was done demonstrating the distribution of signal intensities for each of the four geometries (TABLE II). As may be noted the three-turn angled segment coil did very well.

TABLE I

| COIL EVALUATION - BOTTLE PHANTOM | | | | | | |
|---|---|---|---|---|---|---|
| COIL GEOMETRY | $Q_e$ | $Q_L$ | $Q_e/Q_L$ | $SNR_1$ | $SNR_2$ | $SNR_3$ |
| 1. HALF-SADDLE | 695 | 196 | 3.6 | 76 | 44 | 12.8 |
| 2. ANGLED SEGMENT | 417 | 116 | 3.6 | 80 | 46 | 16.0 |
| 3. FULL-SADDLE | 367 | 216 | 1.7 | 92 | 48 | 21.7 |
| 4. 3-TURN ANGLED | 569 | 106 | 5.8 | 155 | 58 | 23.8 |

TABLE I-continued

| COIL EVALUATION - BOTTLE PHANTOM | | | | | | |
|---|---|---|---|---|---|---|
| COIL GEOMETRY SEGMENT | $Q_e$ | $Q_L$ | $Q_e/Q_L$ | $SNR_1$ | $SNR_2$ | $SNR_3$ |

$SNR_1$ - SIGNAL TO NOISE RATIO USING 1 LITER OF 1, 2 PROPANDIOL AND WATER (50%)
$SNR_2$ - SIGNAL TO NOISE RATIO USING 1 LITER OF NORMAL SALINE AND WATER (50%)
$SNR_3$ - SIGNAL TO NOISE RATIO USING VOLUNTEER HUMAN HEAD

TABLE II

COIL EVALUATION - HUMAN HEAD
TEQ = C2SEA  NSL = 1  SLT = 1  NSQ = 1  ROI = 150 PIXELS

| COIL | REGION | $X_s$ | $X_n$ | $RMS_n$ | SNR | % Gain |
|---|---|---|---|---|---|---|
| HALF SADDLE | PONS | 294 | 31.6 | 18.3 | 14.3 | |
| | PARIETAL | 246.9 | | | 11.8 | |
| | FRONTAL | 189.3 | | | 8.6 | |
| | | | | | X = 12.8 | 0% |
| FULL-SADDLE | PONS | 423.2 | 29.6 | 15.6 | 25.2 | |
| | PARIETAL | 292.7 | | | 16.9 | |
| | FRONTAL | 417 | | | 24.8 | |
| | OCCIPITAL | 340 | | | 19.9 | |
| | | | | | X = 21.7 | 70% |
| Angled Segment | PONS | 374.6 | 34.2 | 20.6 | 16.5 | |
| | PARIETAL | 441.1 | | | 19.8 | |
| | FRONTAL | 392.5 | | | 17.7 | |
| | OCCIPITAL | 246.8 | | | 10.3 | |
| | | | | | X = 16.0 | 25% |
| Angled Segment With 3 Turns | PONS | 299.3 | 24.7 | 13.1 | 29.8 | |
| | PARIETAL | 416 | | | 29.8 | |
| | FRONTAL | 297.8 | | | 20.8 | |
| | OCCIPITAL | 220.4 | | | 14.9 | |
| | | | | | X = 23.8 | 86% |

In table II, ROI stands for region of interest, SLT stands for slice thickness, NSL means the number of slices, and NSQ refers to the number of sequences. Among other terms, TEQ means technique, C2SEA means the spin-echo pulse technique as detailed above, $X_s$ refers to the mean signal, $X_n$ refers to the mean noise, $RMS_n$ is the root mean square of the noise, the SNR is the signal to noise ratio. signal, $X_n$ refers to the mean noise, $RMS_n$ is the root means square of the noise, and SNR is the signal to noise ratio.

While specific embodiments of the invention have been illustrated and described herein, it is realized that modifications and changes will occur to those skilled in the art. It is therefore, to be understood that the appended claims are intended to cover all such modifications and changes as fall within the true spirit and scope of the invention,

What is claimed is:

1. A receiver coil structure for NMR imaging of a human head attached by a neck, having ear positions, and having a defined axis generally along a line extending from the top of the head through the neck, said coil structure comprising:

a coil lying primarily in a coil plane;
   said coil being generally oval in configuration with sides and defined upper and lower ends spaced by an oval height;
   said coil being sized for positioning around the head oriented such that the coil upper end is adjacent the top of the head, the coil sides are generally adjacent the positions, and the defined head axis lies in the defined coil plane;
   said coil being formed of a conductor which is tubular and of a material which has good electrical conductivity; and
   said coil including an angled segment defined as having a midpoint at the coil lower end and extending from the midpoint along the coil sides towards the coil upper end for a distance corresponding to approximately one-third of the oval height to segment endpoints, said angled segment diverging beginning at the segment endpoints out of the coil plane at an angle such that the coil lower end clears the neck when positioned around the head, and further comprising a component unit located at the upper end of said coil, said coil having terminal ends at the upper end, said component unit mounted to bridge said terminal ends, and said component unit including a capacitor electrically connected to the coil terminal ends to form a parallel resonant circuit.

2. A receiver coil structure in accordance with claim 1, wherein said coil is formed of tubing having an outside diameter in the approximate range of from ⅜ inch to ¾ inch.

3. A receiver coil structure in accordance with claim 2, wherein said coil comprises high purity copper tubing.

4. A receiver coil structure in accordance with claim 3, wherein the angle at which the angled segment diverges is approximately 45° with reference to the coil plane.

5. A receiver coil structure in accordance with claim 3, wherein said coil comprises a single turn.

6. A receiver coil structure in accordance with claim 3, wherein said coil comprises a plurality of turns.

7. A receiver coil structure in accordance with claim 2, wherein the angel at which the angled segment diverges is approximately 45° with reference to the coil plane.

8. A receiver coil structure in accordance with claim 2, wherein said coil comprises a single turn.

9. A receiver coil structure in accordance with claim 2, wherein said coil comprises a plurality of turns.

10. A receiver coil structure in accordance with claim 1, wherein the angle at which the angled segment diverges is approximately 45° with reference to the coil plane.

11. A receiver coil structure in accordance with claim 1, wherein said coil comprises a single turn.

12. A receiver coil structure in accordance with claim 1, wherein said coil comprises a plurality of turns.

* * * * *

UNITED STATES PATENT AND TRADEMARK OFFICE
CERTIFICATE OF CORRECTION

PATENT NO. : 4,784,146
DATED : November 15, 1988
INVENTOR(S) : Anthony A. Mancuso; Jeffrey R. Fitzsimmons; Ray G. Thomas It is certified that error appears in the above-identified patent and that said Letters Patent is hereby corrected as shown below:

In claim 1, column 7, line 61, after "the" and before "positions", insert --ear--.

Signed and Sealed this

Eighteenth Day of April, 1989

*Attest:*

DONALD J. QUIGG

*Attesting Officer*         *Commissioner of Patents and Trademarks*